United States Patent
Langhammer et al.

(10) Patent No.: US 11,010,131 B2
(45) Date of Patent: May 18, 2021

(54) FLOATING-POINT ADDER CIRCUITRY WITH SUBNORMAL SUPPORT

(71) Applicant: Intel Corporation, Santa Clara, CA (US)

(72) Inventors: Martin Langhammer, Alderbury (GB); Bogdan Pasca, Chesham (GB)

(73) Assignee: Intel Corporation, Santa Clara, CA (US)

( * ) Notice: Subject to any disclaimer, the term of this patent is extended or adjusted under 35 U.S.C. 154(b) by 732 days.

(21) Appl. No.: 15/704,313

(22) Filed: Sep. 14, 2017

(65) Prior Publication Data

US 2019/0079728 A1 Mar. 14, 2019

(51) Int. Cl.

| G06F 7/485 | (2006.01) |
|---|---|
| G06F 5/01 | (2006.01) |
| G06F 7/487 | (2006.01) |
| H03K 19/17736 | (2020.01) |
| H03K 19/17724 | (2020.01) |
| G06F 7/499 | (2006.01) |
| H03K 19/1776 | (2020.01) |

(52) U.S. Cl.
CPC .............. *G06F 7/485* (2013.01); *G06F 5/012* (2013.01); *G06F 7/487* (2013.01); *G06F 7/49915* (2013.01); *H03K 19/1776* (2013.01); *H03K 19/17724* (2013.01); *H03K 19/17744* (2013.01)

(58) Field of Classification Search
CPC ..... G06F 7/499–49915; G06F 7/49936; G06F 7/49942; G06F 7/485; G06F 7/487; G06F 7/4876; G06F 7/5443; G06F 17/15; G06F 17/153; G06F 17/16; G06F 5/01; G06F 5/012; H03M 7/24
See application file for complete search history.

(56) References Cited

U.S. PATENT DOCUMENTS

| 3,434,114 A | 3/1969 | Arulpragasam et al. |
|---|---|---|
| 5,696,711 A | 12/1997 | Makineni |
| 6,988,119 B2 | 1/2006 | Hoskote et al. |

(Continued)

OTHER PUBLICATIONS

M. Langhannnner et al., Design and Implementation of an Embedded FPGA Floating Point DSP Block, 2015 IEEE 22nd Symposium on Computer Arithmetic, III Computer Society, 2015 (Year: 2015).*

(Continued)

*Primary Examiner* — Andrew Caldwell
*Assistant Examiner* — Emily E Larocque
(74) *Attorney, Agent, or Firm* — Fletcher Yoder, P.C.

(57) ABSTRACT

An integrated circuit may include a floating-point adder. The adder may be implemented using a dual-path adder architecture having a near path and a far path. The near path may include a leading zero anticipator (LZA), a comparison circuit for comparing an exponent value to an LZA count, and associated circuitry for handling subnormal numbers. The far path may include a subtraction circuit for computing the difference between a received exponent value and a minimum exponent value, at least two shifters for shifting far greater and far lesser mantissa values in parallel, and associated circuitry for handling subnormal numbers. The adder may be dynamically configured to support a first mode that processes FP16 at inputs and outputs, a second mode that processes modified FP16' inputs, and a third mode that processes FP16' at inputs and outputs.

20 Claims, 9 Drawing Sheets

(56) References Cited

U.S. PATENT DOCUMENTS

| | | | |
|---|---|---|---|
| 8,024,393 B2* | 9/2011 | Ho | G06F 7/483 |
| | | | 708/501 |
| 8,645,449 B1 | 2/2014 | Langhammer | |
| 8,706,790 B1 | 4/2014 | Langhammer | |
| 8,996,600 B1 | 3/2015 | Langhammer | |
| 9,053,045 B1 | 6/2015 | Langhammer et al. | |
| 9,104,474 B2 | 8/2015 | Kaul et al. | |
| 2015/0254066 A1 | 9/2015 | Lutz et al. | |
| 2018/0121168 A1* | 5/2018 | Langhammer | G06F 7/49915 |
| 2018/0321938 A1* | 11/2018 | Boswell | G06F 9/30036 |

OTHER PUBLICATIONS

Ehliar, Andreas, Area Efficient Floating-Point Adder and Multiplier with IEEE-754 Compatible Semantics, Dept. of Electrical Engineering, International Conference on Field-Programmable Technology, 2014, 131-138, IEEE, Linköping, Sweden.

Langhammer, U.S. Appl. No. 15/270,495, filed Sep. 20, 2016.

* cited by examiner

FLOATING-POINT ADDER CIRCUITRY WITH SUBNORMAL SUPPORT

BACKGROUND

This invention relates generally to integrated circuits and in particular, to integrated circuits with floating-point arithmetic circuitry.

Programmable logic devices (PLDs) include logic circuitry such as look-up tables (LUTs) and sum-of-product based logic that are configurable to allow a user to customize the circuitry to the use particular needs. In addition to this configurable logic, PLDs also include programmable interconnect or routing circuitry that is used to connect the inputs and outputs of the LEs and LABs. The combination of this programmable logic and routing circuitry is referred to as soft logic.

Besides soft logic, PLDs also include specialized processing blocks that implements specific predefined logic functions and thus cannot be configured by the user. Such specialized processing blocks may include a concentration of circuitry on a PLD that has been partly or fully hardwired to perform one or more specific tasks, such as a logical or a mathematical operation.

One particularly useful type of specialized processing block that has been provided on PLDs is a digital signal processing (DSP) block. A conventional DSP block includes a floating-point adder that only supports "normal" numbers but not "subnormal" numbers. In contrast with normal numbers, subnormal numbers are numbers that are specially encoded, with a predetermined minimum exponent and a mantissa component with an implied leading zero. Due to this special encoding, floating-point adders must handle subnormal numbers differently.

It is within this context that the embodiments described herein arise.

DETAILED DESCRIPTION

The present embodiments relate to integrated circuits and, more particularly, to floating-point adders/subtractors on an integrated circuit. It will be recognized by one skilled in the art, that the present exemplary embodiments may be practiced without some or all of these specific details. In other instances, well-known operations have not been described in detail in order not to unnecessarily obscure the present embodiments.

Figure 1:
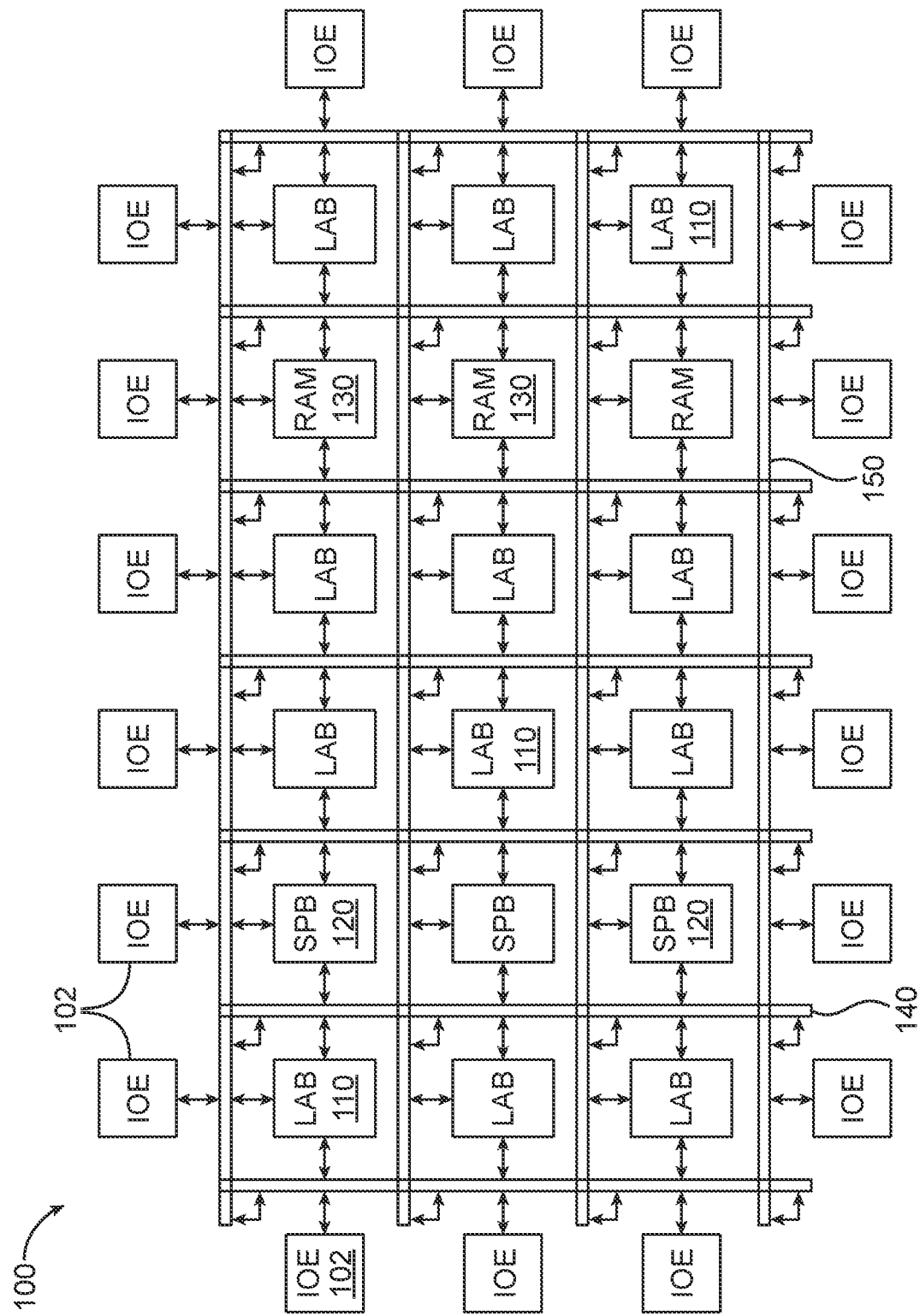
FIG. 1 is a diagram of an illustrative integrated circuit having specialized processing blocks in accordance with an embodiment.

An illustrative embodiment of an integrated circuit such as programmable logic device (PLD) 100 having an exemplary interconnect circuitry is shown in FIG. 1. As shown in FIG. 1, the programmable logic device (PLD) may include a two-dimensional array of functional blocks, including logic array blocks (LABs) 110 and other functional blocks, such as random-access memory (RAM) blocks 130 and specialized processing blocks such as specialized processing blocks (SPB) 120. Functional blocks such as LABs 110 may include smaller programmable regions (e.g., logic elements, configurable logic blocks, or adaptive logic modules) that receive input signals and perform custom functions on the input signals to produce output signals.

Programmable logic device 100 may contain programmable memory elements. Memory elements may be loaded with configuration data (also called programming data) using input/output elements (IOEs) 102. Once loaded, the memory elements each provide a corresponding static control signal that controls the operation of an associated functional block (e.g., LABs 110, SPB 120, RAM 130, or input/output elements 102).

In a typical scenario, the outputs of the loaded memory elements are applied to the gates of metal-oxide-semiconductor transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, mechanical memory devices (e.g., including localized mechanical resonators), mechanically operated RAM (MORAM), combinations of these structures, etc. Because the memory elements are loaded with configuration data during programming, the memory elements are sometimes referred to as configuration memory, configuration RAM (CRAM), configuration memory elements, or programmable memory elements.

In addition, the programmable logic device may have input/output elements (IOEs) 102 for driving signals off of device 100 and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip.

If desired, the programmable logic device may have input/output elements 102 arranged in different ways. For example, input/output elements 102 may form one or more columns of input/output elements that may be located anywhere on the programmable logic device (e.g., distributed evenly across the width of the PLD). If desired, input/output elements 102 may form one or more rows of input/output elements (e.g., distributed across the height of the PLD). Alternatively, input/output elements 102 may form islands of input/output elements that may be distributed over the surface of the PLD or clustered in selected areas.

The PLD may also include programmable interconnect circuitry in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire. If desired, the interconnect circuitry may include double data rate interconnections and/or single data rate interconnections.

If desired, routing wires may be shorter than the entire length of the routing channel. A length L wire may span L functional blocks. For example, a length four wire may span four blocks. Length four wires in a horizontal routing channel may be referred to as "H4" wires, whereas length four wires in a vertical routing channel may be referred to as "V4" wires.

Different PLDs may have different functional blocks which connect to different numbers of routing channels. A three-sided routing architecture is depicted in FIG. 1 where input and output connections are present on three sides of each functional block to the routing channels. Other routing architectures are also intended to be included within the scope of the present invention. Examples of other routing architectures include 1-sided, 1½-sided, 2-sided, and 4-sided routing architectures.

In a direct drive routing architecture, each wire is driven at a single logical point by a driver. The driver may be associated with a multiplexer which selects a signal to drive on the wire. In the case of channels with a fixed number of wires along their length, a driver may be placed at each starting point of a wire.

Note that other routing topologies, besides the topology of the interconnect circuitry depicted in FIG. 1, are intended to be included within the scope of the present invention. For example, the routing topology may include diagonal wires, horizontal wires, and vertical wires along different parts of their extent as well as wires that are perpendicular to the device plane in the case of three dimensional integrated circuits, and the driver of a wire may be located at a different point than one end of a wire. The routing topology may include global wires that span substantially all of PLD 100, fractional global wires such as wires that span part of PLD 100, staggered wires of a particular length, smaller local wires, or any other suitable interconnection resource arrangement.

Furthermore, it should be understood that the present embodiments may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Figure 2:
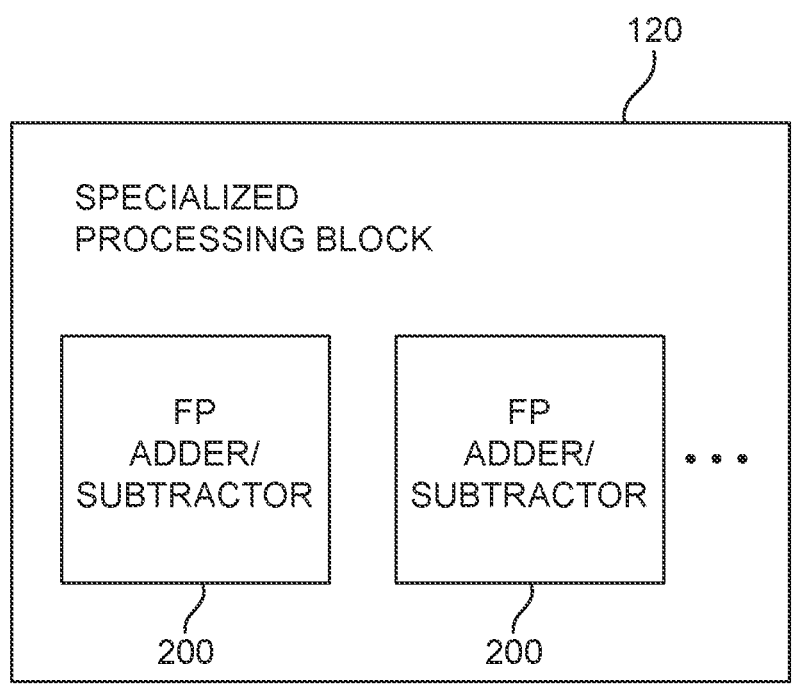
FIG. 2 is a diagram showing how a specialized processing block may include one or more floating-point adder circuits in accordance with an embodiment.

FIG. 2 is a diagram showing how a specialized processing block may include two or more floating-point (FP) addition/subtraction circuits. As shown in FIG. 2, specialized processing block (sometimes referred to as a digital signal processing block or "DSP" block) may include one or more floating-point adder/subtractor circuits 200.

Floating-point numbers are commonplace for representing real numbers in scientific notation in computing systems and are designed to cover a large numeric range and diverse precision requirements. The IEEE 754 standard is commonly used for floating-point numbers. A floating-point number includes three different parts: (1) the sign of the floating-point number, (2) the mantissa, and (3) the exponent. Each of these parts may be represented by a binary number and, in the IEEE 754 format, have different bit sizes depending on the precision (see, e.g., FIG. 3).

Figure 3:
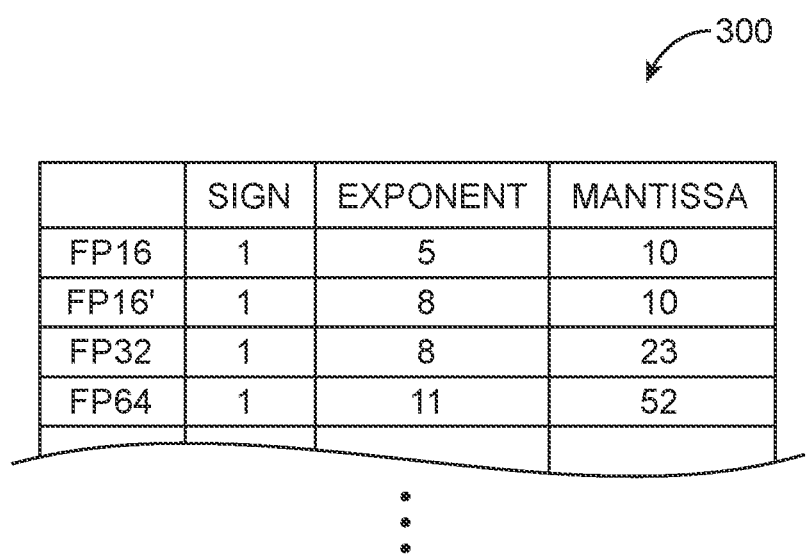
FIG. 3 is a diagram showing different floating-point formats in accordance with an embodiment.

As shown in FIG. 3, a single precision floating-point number format (sometimes abbreviated as "FP32") requires 32 bits, which are distributed as follows: one sign bit (bit 32), eight exponent bits (bits [31:24]), and 23 mantissa bits (bits [23:1]). A double precision floating-point number format (sometimes abbreviated as "FP64") requires 64 bits including one sign bit (bit 64), 11 exponent bits (bits [63:53]), and 52 mantissa bits (bits [52:1]). A half precision floating-point number format (sometimes abbreviated as "FP16") requires only 16 bits, which are distributed as follows: one sign bit (bit 16), five exponent bits (bits [15:11]), and ten mantissa bits (bits [10:1]). An modified or alternate half precision floating-point number format (sometimes referred to as modified FP16, FP16', or FP16+++) requires 19 bits, which are distributed as follows: one sign bit (bit 19), eight exponent bits (bits [18:11]), and ten mantissa bits (bits [10:1]). The three additional exponent bits in modified FP16' can help the floating-point adder better handle subnormal numbers with an extended dynamic range and improved accuracy.

The sign of a floating-point number according to the IEEE 754 standard is represented using a single bit, where a "0" denotes a positive number and a "1" denotes a negative number. As IEEE 754 floating-point numbers are defined in this signed magnitude format, additional and subtraction operations are essentially the same.

The exponent of a floating-point number preferably is an unsigned binary number which, for the FP32 single precision format, ranges from 0 to 255. In order to represent a very small number, it is necessary to use negative exponents. Thus, the exponent preferably has a bias that should be subtracted from the unsigned exponent value. For single precision floating-point numbers, the bias preferably is 127. For example, a value of 140 for the exponent actually represents (140-127)=13, and a value of 101 represents (101-127)=−26. For the FP16 half precision number format, the exponent bias preferably is 15. For the FP16' modified half precision format, the exponent bias preferably is 127 (i.e., the same as for FP32 since the number of exponent bits for both are identical). For simplicity, the floating-point adder architectures described herein use the FP16 format, which is merely illustrative. In general, the circuit techniques and improvements may be applied to any suitable IEEE 754 floating-point number format.

As discussed above, according to the IEEE 754 standard, the mantissa is typically a normalized number (i.e., it has no leading zeroes and represents the precision or fractional component of a floating-point number). Because the mantissa is stored in binary format, the leading bit can either be a 0 or a 1. For a normalized number, the leading bit will always be a 1. Thus, "normal" float-point values are encoded as follows:

$$x = (-1)^s 2^{e-bias} 1 \cdot F \text{ if } e \geq 1 \qquad (1)$$

where s represents the sign bit, e represents the unsigned exponent value, and F represents the mantissa bits. The smallest normal or "non-subnormal" number in FP16 is therefore equal to:

$$x_{reg\_min} = (-1)^s 2^{1-bias} 1.0 = (-1)^s 2^{-14} * 1.0 \quad (2)$$

In contrast to normal floating-point numbers, there is another type of floating-point numbers that are smaller than the normal floating-point numbers, which are sometimes referred to as "subnormal" or "denormalized" numbers. Subnormal numbers are floating-point values that are encoded as follows:

$$x = (-1)^s 2^{e\_min} 0.F \text{ if } e=0 \quad (3)$$

where e_min is set equal to (1-bias)=-14, assuming the binary FP16 format. Although the biased exponent stored in the exponent field is all zeros (e.g., 00000), its value is actually 1. Consequently, subnormal inputs are considered to be having an exponent 1 with a leading bit in front of the radix point being a 0. In other words, an exponent encoding of zero actually represents -14 when taking into account bias. The fractional bits F are not all zeros; otherwise, the value would represent the encoding of zero. The largest subnormal number in FP16 is therefore equal to:

$$x_{sub\_max} = (-1)^s 2^{e\_min} 0.1111111111 = (-1)^s 2^{-14} * (1 - 2^{-10}) \quad (4)$$

whereas smallest subnormal number in FP16 is equal to:

$$x_{sub\_min} = (-1)^s 2^{e\_min} 0.0000000001 = (-1)^s 2^{-24} \quad (5)$$

Figure 4:
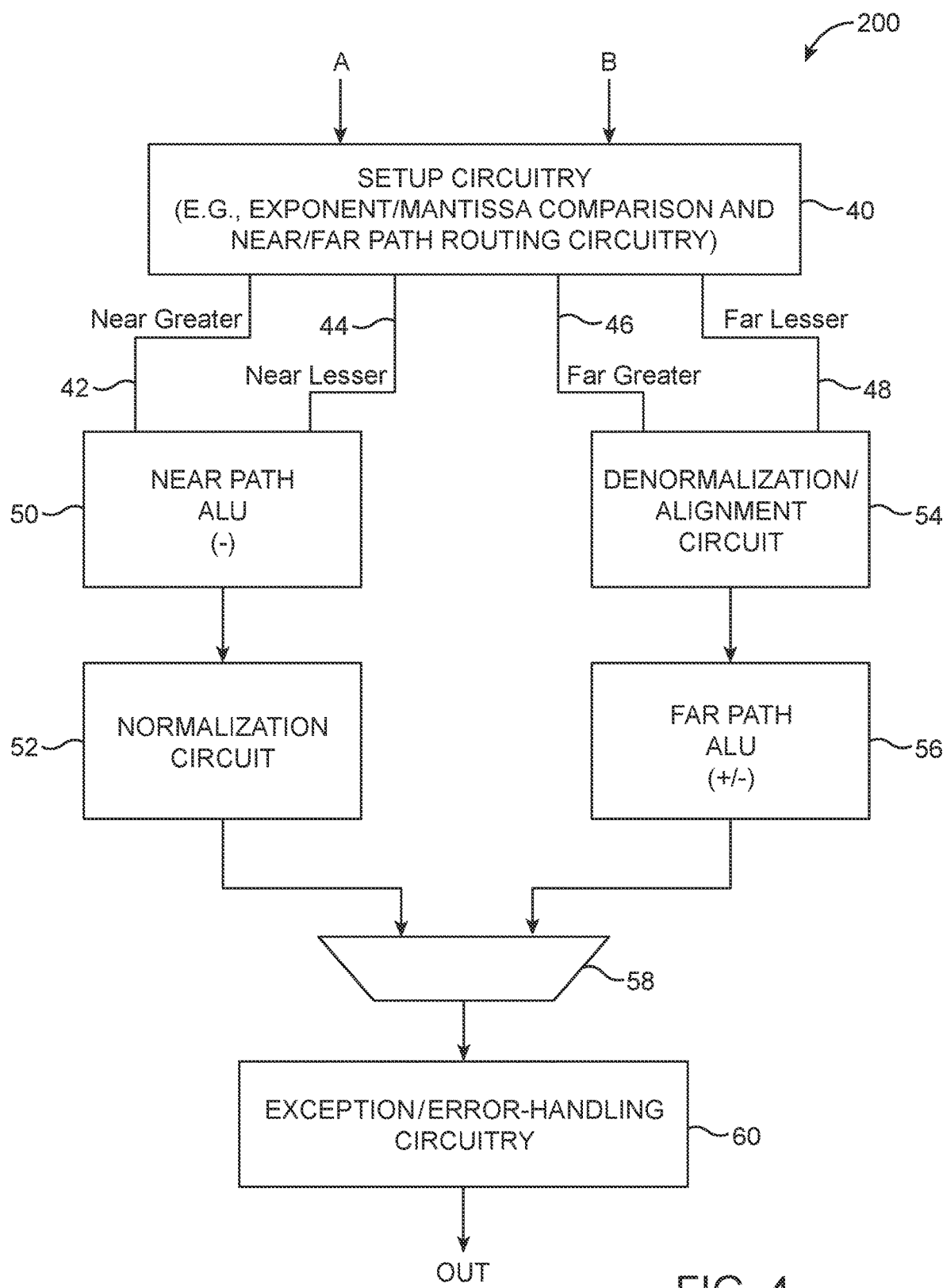
FIG. 4 is a diagram of an illustrative dual path floating-point adder architecture in accordance with an embodiment.

Floating-point adder circuit 200 may be configured to be able to handle not only normal (non-subnormal) numbers but also subnormal numbers. FIG. 4 is a diagram showing one suitable implementation of adder circuit 200 that is capable of supporting subnormal numbers. As shown in FIG. 4, adder 200 may include setup circuitry such as exponent/mantissa comparison and near/far path routing circuitry 40 that receives inputs A and B (i.e., the exponents and mantissa of numbers A and B). Circuitry 40 compares the exponents and also mantissas of inputs A and B, and splits the numbers into a "near" path and a "far" path.

If the difference of the exponents is equal to zero or one (i.e., if the magnitude of the difference between the exponent of A and the exponent of B is less than or equal to one), then the near path may be used (where the value of 1 is set as the predetermined threshold value). In the near path, typically only subtraction occurs. The larger number, which could be either A or B, will be routed to the "near greater" path 42, whereas the smaller number will be routed to the "near lesser" path 44.

On the other hand, if the magnitude of the difference of the exponents is greater than one or for a true addition operation, then then far path may be taken (e.g., the far path may handle addition for the near values as well). The larger number, which could be either A or B, will be routed to the "far greater" path 46, whereas the smaller number will be routed to the "far lesser" path 48. The exemplary architecture of FIG. 4 in which the values are split into near and far paths may sometimes be referred to as a "dual path" adder architecture.

To illustrate the operation of the near path, consider an example where A is equal to $+(2^5)*(1.xxxxxxxxxx)$ and where B is equal to $-(2^4)*(1.yyyyyyyyyy)$. In order to match the exponents, B may be right-shifted by one position (i.e., to divide B by a factor of 2 since the exponent is base two). Since B is negative, the magnitude of B may then be subtracted from A, which might then yield 0.00001zzzzz, with a corresponding exponent of 5. To normalize 0.00001zzzzz, the number of leading zeros may be determined and the result can be left shifted by the appropriate number of bits. As shown in the example above, the near path may involve a subtraction operation (which can be performed using near path arithmetic logic unit 50) and a normalization operation (which can be performed using normalization circuit 52).

To illustrate the operation of the far path, consider an example where A is equal to $+(2^5)*(1.xxxxxxxxxx)$ and where B is equal to $(-1)^s(2^2)*(1.yyyyyyyyyy)$. In order to match the exponents, B may be right-shifted by three bit positions (i.e., to divide B by 8 since the exponent is base two). Depending on whether B is positive or negative, the resulting significant can either be: 10.zzzzzzzzzz, 1.zzzzzzzzzz, or 0.1zzzzzzzzz, with a corresponding exponent of 5. In the first case, a right-shift-by-one operation is needed. In the second case, no shift is needed. In the third case, a left-shift by one operation is needed. As shown in the example above, the far path may involve right shifting the far less number (which can be performed using denormalization/alignment circuit 54) and an addition/subtraction operation (which can be performed using circuit 56).

Still referring to FIG. 4, floating-point adder circuit 200 may also include a multiplexing circuit such as multiplexer 58 having a first data input that receives an output signal from normalization circuit 52 in the near far, a second data input that receives an output signal from +/- circuit 56 in the far path, and an output at which either the near path result or the far path result may be routed. The output of multiplexer 58 may then be fed through exception/error handling circuitry 60 to produce final output signal OUT.

Figure 5:
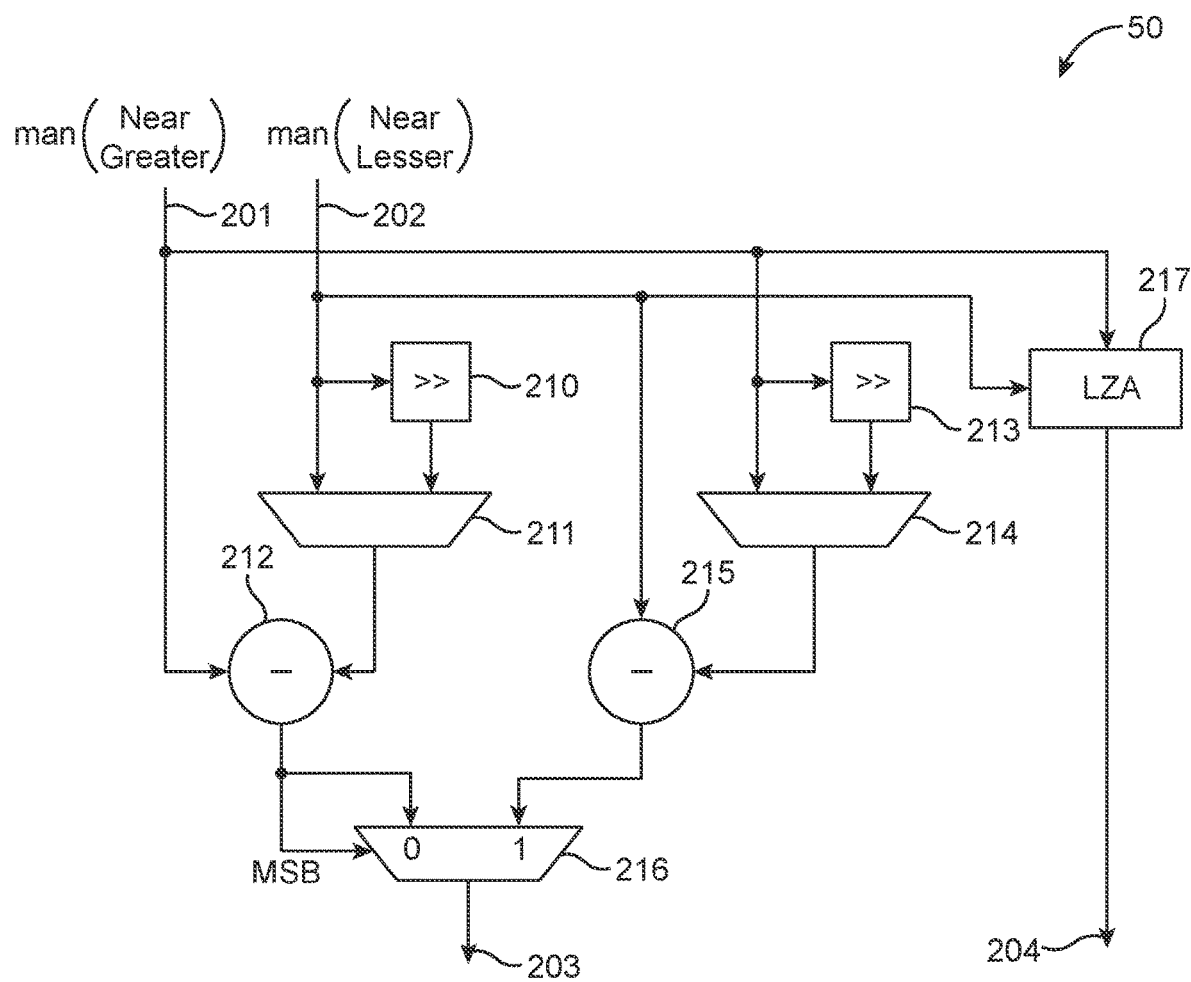
FIG. 5 is a circuit diagram of an illustrative near-path arithmetic circuit in accordance with an embodiment.

FIG. 5 is a circuit diagram of an illustrative near-path arithmetic logic unit (ALU) such as arithmetic circuit 50 having subnormal support. As shown in FIG. 5, circuit 50 includes right shifting circuits 210 and 213, multiplexing circuits 211, 214, and 216, subtraction circuits 212 and 215, and leading zero anticipation (LZA) circuit 217. The mantissa of the near greater value X is received at input 201, whereas the mantissa of the near lesser value Y is received at input 202.

Multiplexer 211 has a first input that receives mantissa (Y) directly from input 202, a second input that receives a right-shifted version of mantissa(Y) from input 202 via right shifter 210, and an output. Subtraction circuit 212 has a first input that receives mantissa(X) directly from input 201, a second input that receives signals from the output of multiplexer 211, and an output. Right shifter 210 performs a 1-bit right alignment for the scenario where the difference between the exponents is equal to 1.

Multiplexer 214 has a first input that receives mantissa(X) directly from input 201, a second input that receives a right-shifted version of mantissa(X) received from input 201 via right shifter 213, and an output. Subtraction circuit 215 has a first input that receives mantissa(Y) directly from input 202, a second input that receives signals from the output of multiplexer 214, and an output. Right shifter 213 performs a 1-bit right alignment for the scenario where the difference between the exponents is equal to 1.

Multiplexer 216 has a first (0) input that receives signals from the output of subtraction circuit 212, a second (1) input that receives signals from the output of subtraction circuit 215, a control input that receives the most significant bit (MSB) of the output of subtraction circuit 212, and an output 203. Configured in this way, the left subtraction circuit 212 computes a first difference that is equal to (mantissa(X)−mantissa(Y)) while the right subtraction circuit 215 computes a second difference that is equal to (mantissa(Y)− mantissa(X)). The two subtraction operations are therefore computed in parallel. The MSB of the output of subtraction circuit 212 will indicate whether (mantissa(X)−mantissa(Y)) is positive or negative. If the MSB is 0, multiplexer 216 will route the result from subtractor 212 to its output 203. If the MSB is 1, multiplexer 216 will route the result from subtractor 215 to its output 203.

Leading zero anticipator (LZA) 217 may receive mantissa (X) from input 201 and mantissa(Y) from input 202. Based on the received mantissas, LZA 217 may be configured to anticipate or estimate the number of leading zeros that might show up at output 203. LZA 217 may produce an estimated count that is off by at most one unit.

Figure 6:
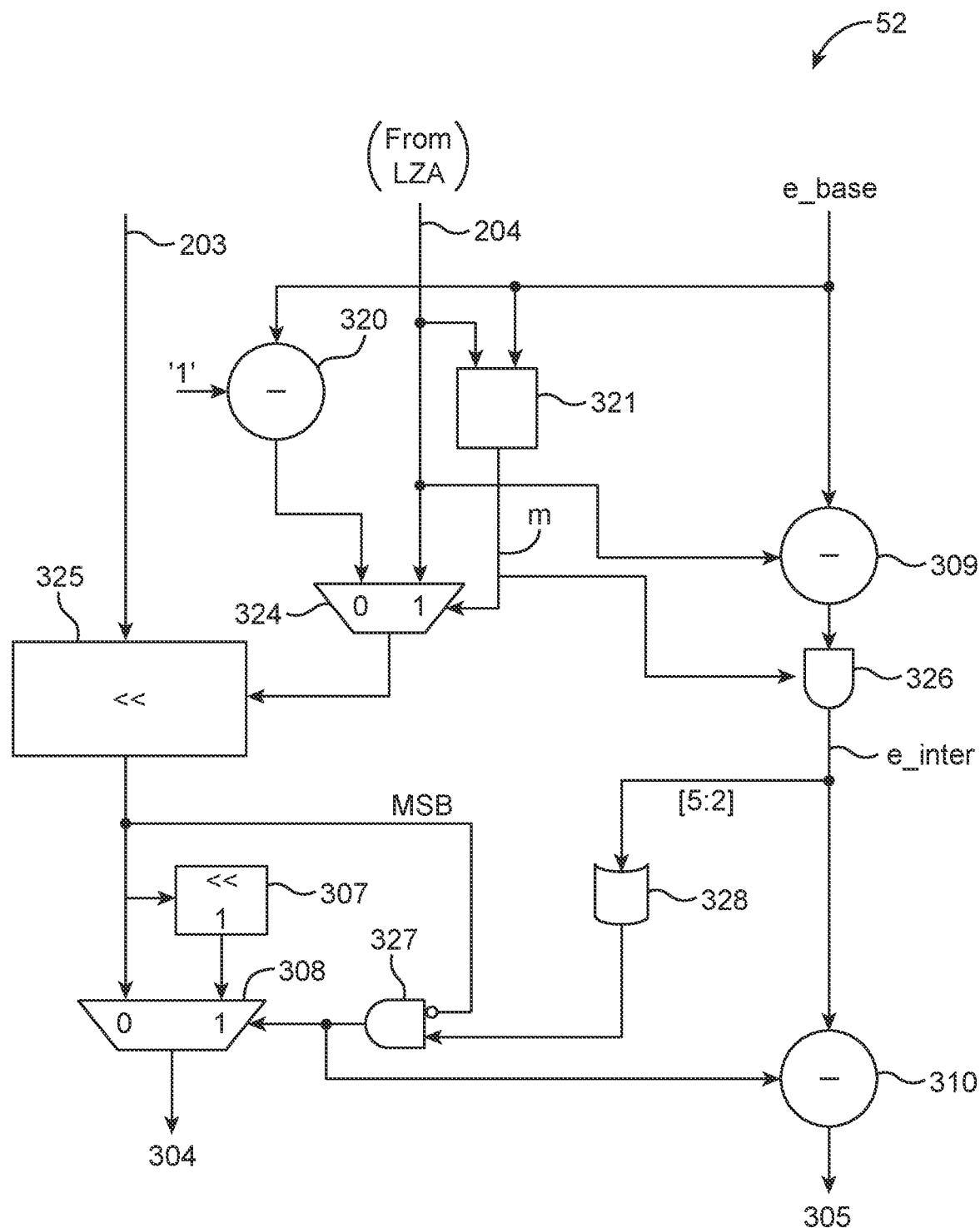
FIG. 6 is a circuit diagram of an illustrative near-path normalization circuit in accordance with an embodiment.

FIG. 6 is a circuit diagram of an illustrative near-path normalization circuit 52. As shown in FIG. 6, near-path normalization circuit 52 may include left shifting circuit 325, one-bit left shifting circuit 307, multiplexers 308 and 324, subtraction circuits 320, 309, and 310, comparison circuit 321, logic AND gates 326 and 327, and logic OR gate 328. Left shifter 325 may receive the positive mantissa difference from output 203 (i.e., the output of multiplexer 216 in FIG. 5), may receive a count (which determines how much left shifting will be performed) from multiplexer 324, and may generate a corresponding shifted value at its output.

Circuit 52 may also receive the estimated count from the LZA via path 204 and receive a base exponent e_base. The base exponent represents the larger exponent in A and B, which can be output by setup circuitry 40 (FIG. 4). Subtraction circuit 320 may be configured to compute an output that is equal to e_base minus a predetermined value of 1. Comparison circuit 321 may be configured to compare e_base with the LZA count value. Comparison circuit 321 may generate an output m that is equal to 1 if e_base is greater than the LZA count or is equal to 0 if e_base is less than or equal to the LZA count. Multiplexer 324 may have a first (0) input that receives (e_base−1) from subtractor 320, a second (1) input that directly receives the LZA count value, a control input that receives control signal m from comparison circuit 321, and an output that controls how much shifting is performed by shifter 325.

Exponent e_base represents the maximum amount of left shifting that is allowed for normal numbers. As long as e_base is greater than the LZA count (i.e., whenever m is asserted), left shifting circuit 325 will perform shifting by the LZA count. However, when e_base is less than or equal to the LZA count (i.e., whenever m is deasserted, which represents the subnormal case), left shifting circuit 325 should only be permitted to perform shifting by (e_base−1) to ensure that the exponent is not less than 1. Comparison circuit 321 and multiplexer 324 configured in the arrangement of FIG. 6 ensure that these criteria are satisfied.

Subtraction circuit 309 may be configured to compute the difference between e_base and the LZA count and to output a corresponding intermediary exponent e_inter. Logic AND gate 326 may receive e_inter and may be enabled using control signal m to serve as a gating circuit that selectively passes through e_inter to its output. In response to receiving m=1, e_inter may pass through unaltered to the output of gate 326. In response to receiving m=0, gate 326 may force e_inter=1.

For the near path, the shifted value at the output of circuit 325 may either be 1.z or 0.1z. Thus, the output of circuit 325 sometimes has to be shifted by one additional bit to the left using shifter 307. Multiplexer 308 may have a first (0) input that receives signals directly from shifter 325, a second (1) input that receives signals from shifter 307, a control input, and an output 304 at which a final mantissa value is provided. Control of multiplexer 308 at least partly depends on the MSB of the output of shifter 325. If the MSB is 1, the first (0) input of multiplexer 308 should be selected. If the MSB is 0, the second (1) input of multiplexer 308 should be selected.

An additional consideration for selecting either input (0) or (1) of multiplexer 308 depends on whether e_inter is greater than one. Logic OR gate 328 monitors the upper bits of e_inter (e.g., gate 328 looks at e_inter[5:2], ignoring the least significant bit [1]) and outputs a high value only when e_inter is greater than a predetermined value of one (i.e., whenever at least one of the upper bits is non-zero). This example where a logic OR gate is used to detect a greater-than-one condition is merely illustrative; other logic implementations may be used, if desired.

As described above, intermediary exponent e_inter is set to 1 for handling the subnormal case. Thus, in the subnormal scenario, gate 328 will output a 0. Logic AND gate 327 has an inverting input that receives the MSB from the output of shifter 325 and a non-inverting input that receives the output of gate 328. Configured in this way, AND gate 327 will output a 0 if e_inter is forced to a 1 and will only output a 1 if e_inter is greater than 1 and if the MSB received at its inverting input is low. The output of AND gate 327 is coupled to the control input of multiplexer 308.

Subtraction circuit 310 may be configured to compute the difference between e_inter provided at the output of gate 326 and the bit provided at the output of gate 327 and to generate a corresponding output 305. Configured in this way, the final exponent at output 305 will be equal to (e_inter−1) whenever handling normal numbers and when the MSB at the output of 325 is low or will be equal to 1 whenever handling subnormal numbers. Selecting the (1) input of multiplexer 308 to perform the additional one-bit left shift is sometimes referred to as "fine" normalization. Whenever fine normalization is performed, the near path exponent at output 305 will be decremented by one using subtracting circuit 310.

Circuits 217 of FIG. 5 and circuits 320, 321, 324, 326, 327, and 328 of FIG. 6 help with subnormal normalization and are therefore sometimes referred to collectively as near-path subnormal control circuitry. The exemplary arrangement of FIGS. 5 and 6 are merely illustrative. If desired, other suitable ways of implementing similar concepts can be used to support subnormal number handling in the near path.

Figure 7:
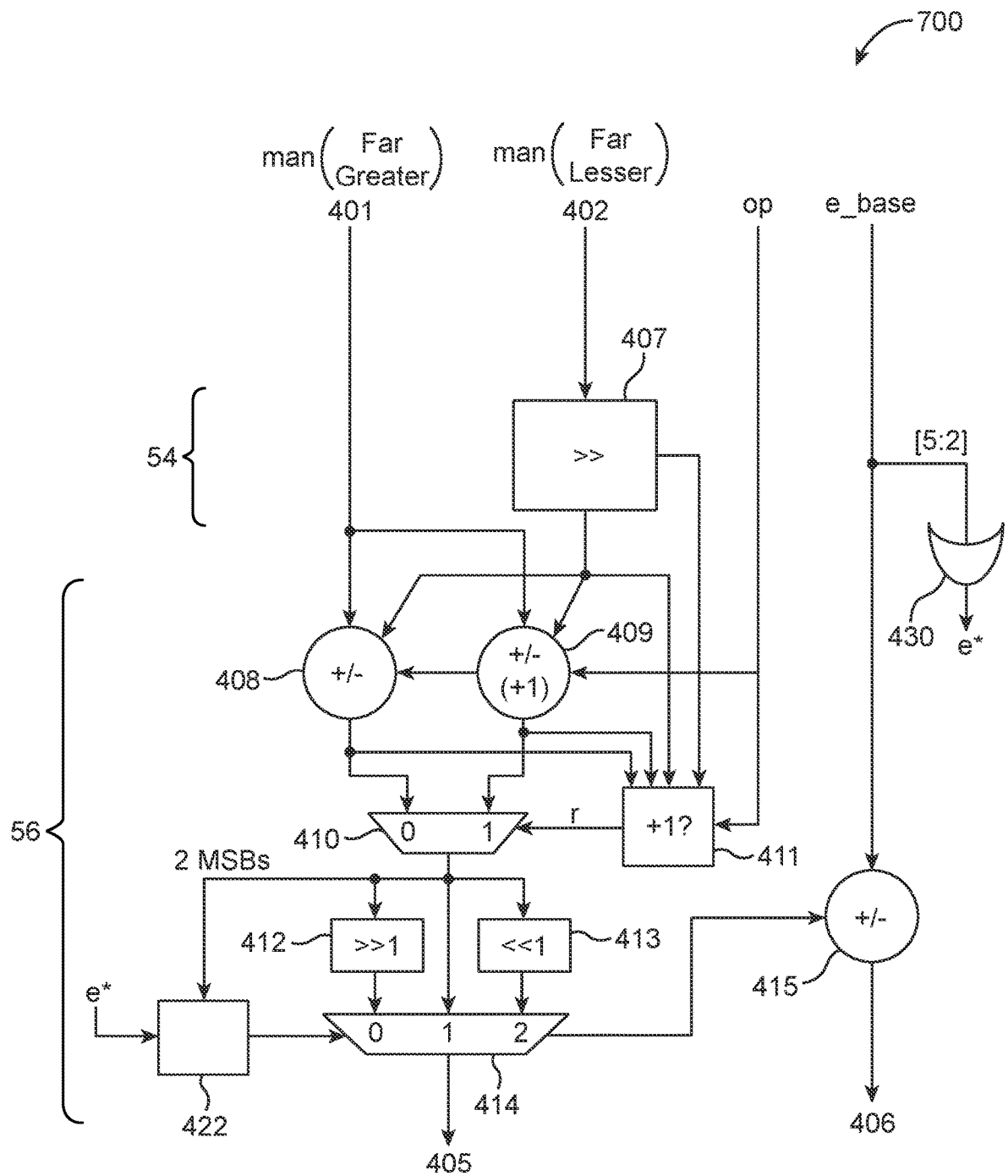
FIG. 7 is a circuit diagram of far-path denormalization and arithmetic circuitry in accordance with an embodiment.

FIG. 7 is a circuit diagram of far-path denormalization and arithmetic circuitry 700, which includes denormalization/alignment circuit 54 and far-path arithmetic logic unit 56. The mantissa of the far greater value (i.e., mantissa(X)) is received at input 401, whereas the mantissa of the far lesser value (i.e., mantissa(Y)) is received at input 402. Circuitry 700 may also receive base exponent e_base and an operation type "op" indicating whether the current operation is an add or subtract from setup circuitry 40 (FIG. 4). Circuit 54 may include a right shifting circuit 407 for shifting mantissa(Y) by the difference in the exponent values.

As shown in FIG. 7, far-path ALU 56 may include a first adder/subtractor 408, a second adder/subtractor 409, a third adder/subtractor 415, multiplexing circuits 410 and 414, rounding condition selection circuit 411, one-bit right shifting circuit 412, one-bit left shifting circuit 413, logic OR gate 430, and control circuit 422. Circuit 408 may be configured to compute either the addition or subtraction of mantissa(X) and the left-shifted version of mantissa(Y). Meanwhile, circuit 409 may be configured to compute a rounded version of either the addition or subtraction of mantissa(X) and the left-shifted version of mantissa(Y).

Rounding condition selector 411 may receive the results from circuits 408 and 409, the output from circuit 407, and signal op to determine whether the result from circuit 408 or the result from circuit 409 should be used. Selector 411 may output signal r=0 if no rounding is necessary and signal r=1 if rounding is required. Multiplexer 410 may have a first (0) input that receives a result from circuit 408, a second (1) input that receives a result from circuit 409, a control input that receives signal r from selector 411, and an output at which an intermediary mantissa is provided.

In the far path, the intermediary mantissa generated at the output of multiplexer 410 may either be 01.z, 10.z, or 00.1z in the subnormal case. In the first case, the intermediary mantissa is already normalized, so no shifting is required. In the second case, the intermediary mantissa has to be right-shifted by one bit, which can be performed using shifter 412. In the third case, the intermediary mantissa has to be left-shifted by one bit, which can be performed using shifter 413. Multiplexer 414 has a first (0) input that receives the right-shifted version from circuit 412, a second (1) input that receives the unaltered intermediary mantissa directly from the output of multiplexer 410, a third (2) input that receives the left-shifted version from circuit 413, a control input, and an output 405 on which the far path mantissa is provided.

Multiplexer 414 may be configured using control circuit 422 (sometimes referred to as a multiplexer control circuit). Control circuit 422 may receive the two MSBs of the intermediary mantissa and also signal e* that is generated by logic OR gate 430. Gate 430 may receive the upper bits of e_base and may output signal e* that indicates whether e_base is greater than a predetermined value of 1. This example where a logic OR gate is used to detect a great-than-one condition is merely illustrative; other logic implementations may be used, if desired. If e_base is greater than 1, at least one of the upper bits of e_base will be non-zero, thereby forcing e* high. Signal e* will only be 0 if e_base is equal to 1 in the subnormal case.

First, control circuit 422 may configure multiplexer 414 to select its (0) input if the two MSBs=10 and may configure circuit 415 to increment e_base by 1 to generate output 406. Second, control circuit 422 may configure multiplexer 414 to select is (1) input if the two MSBs=01, or if the two MSBs=00 and e*=0 (i.e., in the subnormal case where the intermediary mantissa cannot be shifted to the left any further), and may also configure circuit 415 to keep e_base unaltered at output 406. Third, control circuit 422 may configure multiplexer 414 to select its (2) input if the two MSBs=00 and e*=1, and may also configure circuit 415 to decrement e_base by 1 to generate output 406.

Circuits 422, 415, and 430 of FIG. 7 help with subnormal number computing and are therefore sometimes referred to collectively as far-path subnormal computation circuitry. The exemplary arrangement of FIG. 7 is merely illustrative. If desired, other suitable ways of implementing similar concepts can be used to support subnormal number handling in the far path.

Figure 8C:
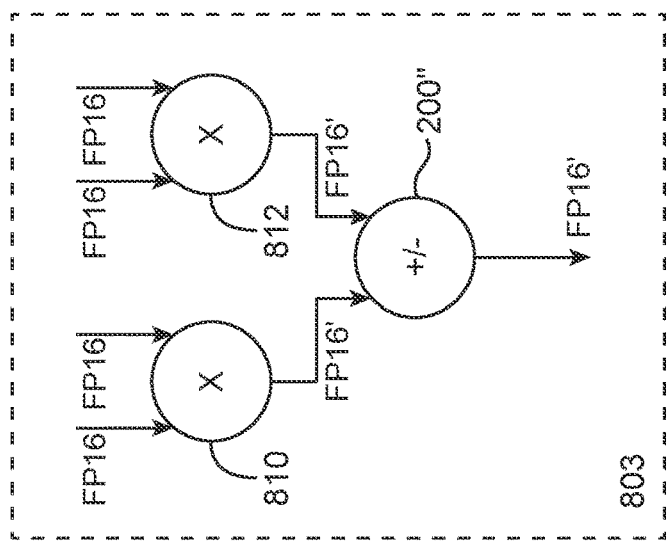
FIG. 8C is a diagram of an illustrative specialized processing block that includes a floating-point adder that is capable of handling modified FP16 at its inputs and output in accordance with an embodiment.

Floating-point adder circuit 200 implemented using the circuitry shown in FIGS. 4-7 are often included in specialized processing blocks that implement dot products. Such type of specialized processing blocks may include multiplication circuits 810 and 812 that compute first and second products, respectively, and a floating-point adder 200 for combining the first and second products (see, e.g., FIG. 8A). As shown in FIG. 8A, adder 200 in configuration 801 of FIG. 8A, which uses the near and far path implementation shown in FIGS. 5-7, supports subnormal processing on both inputs and outputs in the FP16 format.

Figure 8B:
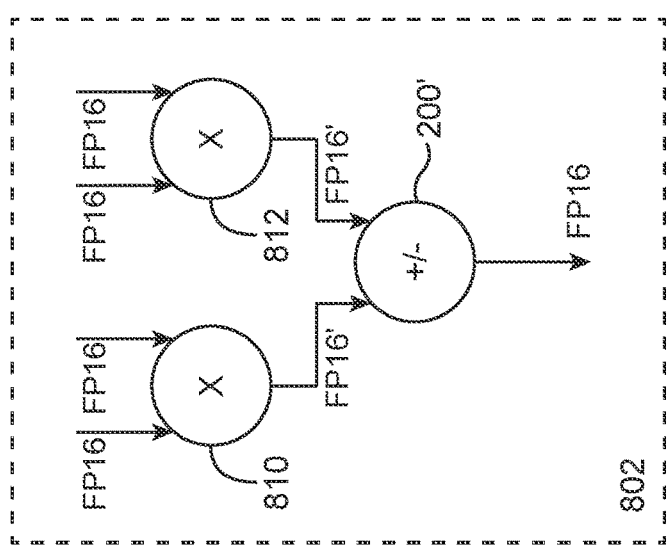
FIG. 8B is a diagram of an illustrative specialized processing block that includes a floating-point adder that is capable of handling modified FP16 (or FP16') at its inputs in accordance with an embodiment.
Figure 8A:
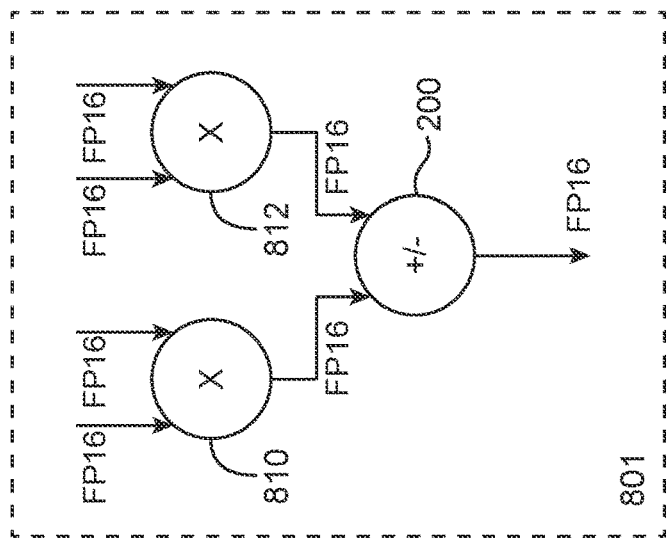
FIG. 8A is a diagram of an illustrative specialized processing block that includes a floating-point adder that is capable of handling FP16 at its inputs and output in accordance with an embodiment.

In another suitable embodiment, adder 200' in configuration 802 of FIG. 8B processes inputs in the FP16' format while outputting values in the FP16 format. In yet another suitable embodiment, adder 200" in configuration 803 of FIG. 8C processes both inputs and outputs in the FP16' format. Configuration 803 may be used where the downstream component operates using the floating-point single-precision format FP32 since the number of exponents between F16' and FP32 are identical. In such scenarios, the conversion between FP16' to FP32 involves a mantissa extension, which is realized by padding zeroes to the right of the FP16' mantissa.

The dynamic range of FP16 is less than the dynamic range of FP16'. As such, a normal-range result of the floating-point numbers at the input of adder 200' may be converted to a subnormal range at the output of adder 200'. Moreover, a normal-range result of the floating-point numbers at the input of adder 200' may be converted to an exception-condition range at the output of adder 200'. If desired, an exception result of the floating-point numbers at the input of adder 200' may be converted to a normal range at the output of adder 200'. Optionally, an out-of-range result of the floating-point numbers at the input of adder 200' may be converted to a normal range at the output of adder 200' without losing information contained in the input floating-point numbers. In configuration 802, the input of multipliers 810 may also be FP16. Therefore, a subnormal-range result of the floating-point numbers at the input of multipliers 810 may be converted to a normal range at the output of multipliers 810.

In configuration 802, since the output format is FP16, the minimum allowed exponent value is −14. Exponent values lower than −14 will require subnormal handling (e.g., if in the range from −15 to −25). If the intermediate exponent value post mantissa rounding is less than −25 (i.e., when the intermediate result is less than the smallest subnormal number), an underflow condition is detected and the result is flushed to zero. Typically, the near path processes cases where the operation is a subtraction and the relative shift between the two operands is at most equal to 1. For configuration 802, the near path may only trigger when the lesser exponent is greater than −14. Thus, the near path circuitry need not be changed for configuration 802.

If the exponent value is less than −14, the far path will be used. In one case this can be implemented by zeroing the inputs in the near path, while the far path processes the input values by default. In another case, both the near path and the far path can receive the input values, but multiplexer 58 in FIG. 4 will then select the far path output. The control circuit for the multiplexer 58 may be in circuit 40 of FIG. 4.

Figure 9:
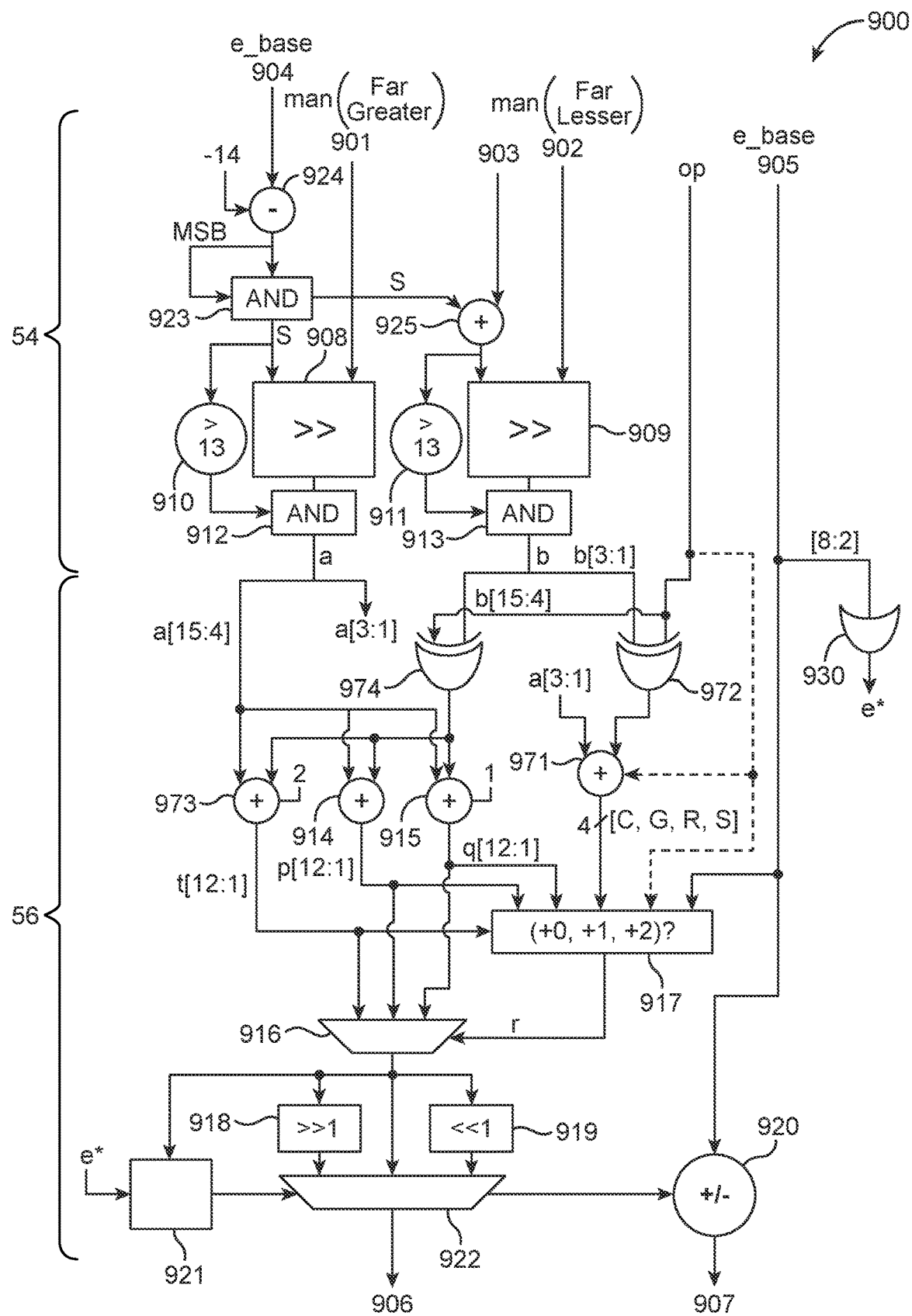
FIG. 9 is a circuit diagram of far-path denormalization and arithmetic circuitry that is capable of handling modified FP16 at its inputs in accordance with an embodiment.

FIG. 9 is a circuit diagram of far-path denormalization and arithmetic circuitry 900 that is capable of handling FP16' at its inputs (as shown in configuration 802 of FIG. 8B). Circuitry 900 includes denormalization/alignment circuit 54 and arithmetic circuit 56. Circuitry 900 may also include logic OR gate 930 for generating signal e*. Gate 930 may receive the upper bits of e_base (e.g., e_base[8:2] since FP16' has 8 exponent bits) and may output signal e* that indicates whether e_base is greater than 1. This example where a logic OR gate is used to detect a great-than-one condition is merely illustrative; other logic implementations may be used, if desired. If e_base is greater than 1, at least one of the upper bits of e_base will be non-zero, thereby forcing e* high. Signal e* will only be 0 if e_base is equal to 1 in the subnormal case.

Circuitry 900 has to be modified in order to handle FP16' at the inputs of circuitry 900. As shown in FIG. 9, the mantissa of the far greater value (i.e., mantissa(X)) is received at input 901, whereas the mantissa of the far lesser value (i.e., mantissa(Y)) is received at input 902. Circuitry 900 may receive base exponent e_base at inputs 904 and 905 and may receive the difference of exponents (i.e., exponent (X)−exponent(Y)) at input 903.

Circuit 52 may further include subtraction circuit 924, addition circuit 925, first right-shifting circuit 908, second right-shifting circuit 909, first comparison circuit 910, second comparison circuit 911, and gating circuits 923, 912, and 913 (e.g., logic AND gates). Subtraction circuit 924 may be configured to compute the difference between e_min (which is equal to −14 for half precision) and e_base at its output (e.g., circuit 924 computes −14 minus e_base).

Gating circuit 923 (e.g., a logic AND gate) receives the computed difference and selectively passes through the difference depending on the whether the computed difference is positive or negative (e.g., by monitoring the MSB of the computed difference). An MSB of 0 indicates a positive difference, meaning that e_base is less than −14 (i.e., a subnormal number is detected) and the difference will be passed through as output signal s. An MSB of 1 indicates a negative difference, meaning that e_base is equal to or greater than −14, and signal s will be set to 0. Circuit 908 may be configured to denormalize mantissa(X) by right shifting mantissa(X) received at input 901 by s bits. Thus, no shifting will occur in the normal case when e_base is equal to or greater than −14, whereas some shifting of (−14 minus e_base) will occur in the subnormal case when e_base is less than −14.

Moreover, if the amount of shifting s is greater than 13, which can be checked using comparison circuit 910, the final shifted value will be forced to a zero using gating circuit 912 (e.g., a logic AND gate). A threshold of 13 is selected since for FP16, only 10 mantissa bits along with 3 additional bits such as guard, rounding, and sticky bits are actually used. Thus, any shifting beyond 13 will only result in a zero output. Circuits 910 and 912 are optional need not be used since any shifting by more than 13 bits will naturally output zero. The final output of the far greater path in circuit 54 is represented as output a, which may be 15 bits: 1 bit for the overflow guard bit, 1 sign bit, and 10 mantissa bits followed by 1 guard bit, 1 round bit, and 1 sticky bit.

The far less path may also be effected by signal s in the subnormal case. Addition circuit 925 may be configured to compute the sum of the difference between exponent(X) and exponent(Y) received at input 903 and signal s. Circuit 909 may be configured to denormalize mantissa(Y) by right shifting mantissa(Y). In the normal case when s=0, circuit 909 will right shift mantissa(Y) by the difference of the exponents. In the subnormal case when s is nonzero, circuit 909 will right shift mantissa(Y) by not only the difference of the exponents but also by an additional s bit positions. Moreover, if the value at the output of circuit 925 is greater than 13, which can be checked using comparison circuit 911, the final shifted value will be forced to a zero using gating circuit 913 (e.g., a logic AND gate). Circuits 911 and 913 are optional need not be used since any shifting by more than 13 bits will naturally output zero. The final output of the far lesser path in circuit 54 is represented as output b, which may have the same number of bits as output a.

Circuit 56 of circuitry 900 may include logic XOR gates 972 and 974, adder circuits 914, 915, 971, and 973, selector circuit 917, multiplexers 916 and 922, shifting circuits 918 and 919, control circuit 921, and adder/subtractor 920. Logic XOR gate 972 may have a first input that receives signal op, a second input that receives the 3 LSBs of output b (i.e., b[3:1]), and an output. Logic XOR gate 974 may have a first input that receives signal op, a second input that receives the remaining MSBs of output b (i.e., b[15:4]), and an output.

Adder 971 may have a first input that receives the 3 LSBs of output a (i.e., a[3:1]), a second input that receives signals from the output of gate 972, a third carry-in input that receives signal op, and an output on which a 4-bit signal is provided (e.g., carry-out bit C, guard bit G, rounding bit R, and sticky bit S). Configured in this way, smaller adder 971 will be used to add the guard, round, and sticky (GRS) bits of the two operands. When the operation is subtraction, a one's complement is executed by logic gate 972 on the GRS bits of output b. The carry-in of adder 971 is also signal op, which completes the two's complement for output b's GRS bits.

Adder 914 has a first input that receives the 12 MSBs of output a (i.e., a[15:4]), a second input that receives signals from the output of gate 974, and an output on which signal p[12:1] is generated. Adder 915 has a first input that receives a[15:4], a second input that receives signals from the output of gate 974, a third carry-in input that receives a one, and an output on which signal q[12:1] is generated. Adder 973 has a first input that receives a[15:4], a second input that receives signals from the output of gate 974, a third carry-in input that receives a two, and an output on which signal t[12:1] is generated. Configured in this way, adders 914, 915, and 973 will add sections a[15:4] and b[15:4] (optionally via one's complement) with corresponding 0, 1, and 2 carry-in values.

Selector circuit 917 may receive and analyze the 4 bits output from adder 971, the two top bits of p, q, and t, op, and e_base to distinguish among the different alignment cases. The logic for circuit 921 is related with the logic for circuit 917. Multiplexer 916 may output a corresponding control signal r, which may determine which one of the three incoming signals (i.e., p, q, or t) is routed to the output of multiplexer 916.

The remaining portion of arithmetic circuit 56 of circuitry 900 is substantially identical to that of circuitry 700. In particular, circuits 918, 919, 922, and 920 of FIG. 9 correspond to circuits 412, 413, 414, and 415 of FIG. 7, respectively, and exhibit the same structure and functional capabilities.

The logic behind circuits 917 and 921 can be explained by first looking at addition, then at subtraction, and then at addition/subtraction when the operands are both aligned to the e=−14 exponent.

For normal scenarios when the greater incoming exponent e_base is greater than or equal to −14 and when the operation (op) is addition, there are three cases to consider. In a first case when p[12:11]=01 and q[12:11]=01 (i.e., when both p and q are directly normalized), then the relevant bits to examine are p[1] and the GRS bits. Bit p[1] may be the bit just left of guard bit G. If GRS=100 and p[1]=1, or if GRS>100, then circuit 917 will configure multiplexer 916 to select q. Otherwise, p will be selected.

In a second case when p[12:11]=01 and q[12:11]=10 (i.e., when p=01.1111111111), then the relevant bits to examine are still p[1] and the GRS bits. If GRS100, then circuit 917 will configure multiplexer 916 to select q, and circuit 921 will configure multiplexer 922 to select the output from shifter 918. Otherwise, circuit 917 will configure multiplexer 916 to select p, and circuit 921 will configure multiplexer 922 to select the output directly from multiplexer 916.

In a third case when p[12:11]=10 and q[12:11]=10, then the relevant bits to consider are p[1] (sometimes represented herein as bit "L") and p[2] (sometimes represented herein as bit "L1"). If L1=1 and LGRS=1000, or if LGRS>1000, then circuit 917 will configure multiplexer 916 to pick q, and circuit 921 will configure multiplexer 922 to select the output from shifter 918.

When the greater incoming exponent e_base is less than −14, then it means that a[3:1]≠000. When the operation (op) is addition, there are also three cases to consider. In a first case when p[12:11]=00 and q[12:11]=00, then a subnormal may be produced in FP16. If C=1 (i.e., if the carry-out bit of adder 971 is high), then q should be selected before rounding. Applying rounding on q would involve examining the GRS bits and q[1]. If q[1]=1 and GRS=100, or if GRS>100, then circuit 917 will configure multiplexer 916 to select t, and circuit 921 will configure multiplexer 922 to select the output directly from multiplexer 916. Otherwise, circuit 917 will configure multiplexer 916 to select q, and circuit 921 will configure multiplexer 922 to select the output directly from multiplexer 916. If C=0, then we examine the GRS bits and p[1]. If p[1]=1 and GRS=100, or if GRS>100, then circuit 917 will configure multiplexer 916 to select q, and circuit 921 will configure multiplexer 922 to select the output directly from multiplexer 916. Otherwise, circuit 917 will configure multiplexer 916 to select p, and circuit 921 will configure multiplexer 922 to select the output directly from multiplexer 916.

In a second case when p[12:11]=00 and q[12:11]=01, then a subnormal may also be produced. If C=1, then we examine the GRS bits and q[1]. If q[1]=1 and GRS=100, or if GRS>100, then circuit 917 will configure multiplexer 916 to select t, and circuit 921 will configure multiplexer 922 to select the output directly from multiplexer 916. Otherwise, circuit 917 will configure multiplexer 916 to select q, and circuit 921 will configure multiplexer 922 to select the output directly from multiplexer 916. If C=0, then we examine the GRS bits and p[1]. If p[1]=1 and GRS=100, or if GRS>100, then circuit 917 will configure multiplexer 916 to select q, and circuit 921 will configure multiplexer 922 to select the output directly from multiplexer 916. Otherwise, circuit 917 will configure multiplexer 916 to select p, and circuit 921 will configure multiplexer 922 to select the output directly from multiplexer 916.

In a third case when p[12:11]=01 and q[12:11]=01, then a subnormal will not be produced. If C=1, then we pick q before rounding and examine the GRS bits and q[1]. If q[1]=1 and GRS=100, or if GRS>100, then circuit 917 will configure multiplexer 916 to select t. Moreover if t[12:11]=01, then circuit 921 will configure multiplexer 922 to select the output directly from multiplexer 916. If, however, t[12:11]=10, then circuit 921 will configured multiplexer 922 to select the output from shifter 918, which should not happen in this scenario. Otherwise, circuit 917 will configure multiplexer 916 to select q, and circuit 921 will configure multiplexer 922 to select the output directly from multiplexer 916. If C=0, then we pick p before rounding and examine the GRS bits and p[1]. If p[1]=1 and GRS=100, or if GRS>100, then circuit 917 will configure multiplexer 916 to select q, and circuit 921 will configure multiplexer 922 to select the output directly from multiplexer 916. Otherwise, circuit 917 will configure multiplexer 916 to select p, and circuit 921 will configure multiplexer 922 to select the output directly from multiplexer 916.

For normal scenarios when the greater incoming exponent e_base is greater than or equal to −14 and when the operation (op) is subtraction, there are also three cases to consider. A first case is when p[12:11]=00 and q[12:11]=00. If e_base is equal to −14, then a subnormal will be produced.

If C=0, let L=p[1]. Else, let L=q[1]. If GRS=100 and L=1, or if GRS>100, then circuit 917 will configure multiplexer 916 to select q, and circuit 921 will configure multiplexer 922 to select the output directly from multiplexer 916. Otherwise, circuit 917 will configure multiplexer 916 to select p. If e_base is greater than −14, then a normal number will be produced. If GRS=110, then circuit 917 will configure multiplexer 916 to select q, and G will be flipped to 0. If RS>10 and if G=1, then circuit 917 will configure multiplexer 916 to select q and flips G to 0; if G=0, then then circuit 917 will configure multiplexer 916 to select p and flips G to 1. Else, circuit 917 will configure multiplexer 916 to select p.

A second case is when p[12:11]=00 and q[12:11]=01, which means that p=0.1111111111. If C=0, then before rounding we should return p. Specifically, if e_base>−14, then rounding will occur as p will be first normalized and then rounded. Therefore, if G=1 and RS≥10, circuit 917 will configure multiplexer 916 to select q, and circuit 921 will configure multiplexer 922 to select the output directly from multiplexer 916. If G=0 and RS>10, circuit 917 will configure multiplexer 916 to select p with flipped G, and circuit 921 will configure multiplexer 922 to select the output from shifter 919. If, however, e_base is equal to −14, then a subnormal output will be assumed, and GRS and p[1] will be examined. If p[1]=1 and GRS=100, or if GRS>100, then circuit 917 will configure multiplexer 916 to select q, and circuit 921 will configure multiplexer 922 to select the output directly from multiplexer 916 to create a subnormal output. Otherwise, circuit 917 will configure multiplexer 916 to select p. If C=1, then before rounding we should return q, and the result will be normalized. If GRS>100 and q[1]=0, then circuit 917 will configure multiplexer 916 to select t, and circuit 921 will configure multiplexer 922 to select the output directly from multiplexer 916. Else, circuit 917 will configure multiplexer 916 to select q.

A third case is when p[12:1]=01 and q[12:11]=01. In this case, the result is normalized before rounding, so there is no need to have a distinct case for e_base equal to −14. If C=1, then before rounding q should be selected. Rounding involves examining q[1] and GRS. If q[1]=1 and GRS=100, or if GRS>100, then circuit 917 will configure multiplexer 916 to select t, and circuit 921 will configure multiplexer 922 to select the output directly from multiplexer 916. Else, circuit 917 will configure multiplexer 916 to select q. If C=0, then before rounding p should be selected. Rounding involves examining p[1] and GRS. If p[1]=1 and GRS=100, or if GRS>100, then circuit 917 will configure multiplexer 916 to select q, and circuit 921 will configure multiplexer 922 to select the output directly from multiplexer 916. Else, circuit 917 will configure multiplexer 916 to select p.

Abnormal scenarios when e_base is less than −14 and when the operation (op) is subtraction will also be handled on the far path. If p[12:11]=00 and q[12:11]=00, then the GRS bits will be examined. If C=0, let L=p[1]. If L=1 and GRS=100, or if GRS>100, then circuit 917 will configure multiplexer 916 to select q, and circuit 921 will configure multiplexer 922 to select the output directly from multiplexer 916. Else, circuit 917 will configure multiplexer 916 to select p. If C=1, let L=q[1]. If L=1 and GRS=100, or if GRS>100, then circuit 917 will configure multiplexer 916 to select t, and circuit 921 will configure multiplexer 922 to select the output directly from multiplexer 916. Else, circuit 917 will configure multiplexer 916 to select q.

In contrast of configuration 802, configuration 803 processes both inputs and outputs in FP16'. The limited range of data at the output of multipliers 810 and 812 (see FIG. 8C)

ensures that no subnormal number can be created at the output of adder 200". For example, the smallest non-zero input to the multipliers is $2^{-14}*2^{-10}=2^{-24}$. The product of two such numbers has the value $2^{-48}$. If these values have different signs and are processed on the near path, the minimum value post a potential cancellation would be $2^{-58}$. A value of $2^{-58}$ is well within the $2^{-126}$ normal range of the FP16' format, so no subnormal can be created. Therefore, the adder architecture is similar to an adder architecture where subnormal numbers are flushed to zero on both inputs and outputs.

If desired, programmable integrated circuit 10 may be dynamically configured to support three different modes of configuration 801, 802, or 803. In particular, exponent processing circuitry should be configured to handle 5-bit exponent fields for configuration 801 and to handle 8-bit exponent fields for configurations 802 and 803. For the far path, the base architecture of FIG. 9 may be used. To support mode 801, shifter 908 may be deactivated by setting the shift value to zero (e.g., by forcing gating logic 923 to output a zero). In other words, signal s may be forced to 0. These changes may also be applied to mode 803.

For the near path, the base architecture of FIG. 6 may be used, which can support both modes 801 and 802. For mode 803, multiplexer 324 may be forced to always shift by the LZA count value received at input 204. Since the exponent cannot become negative in mode 803, output m of comparison circuit 321 should be forced to a 1, which also allows gating circuit 326 to pass through (e_base−LZA count). The downstream logic is similar since the leading zero anticipator is still used.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs), microcontrollers, microprocessors, central processing units (CPUs), graphics processing units (GPUs), etc. Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

EXAMPLES

The following examples pertain to further embodiments.

Example 1 is an integrated circuit, comprising: a floating-point adder circuit that receives a first floating-point number and a second floating-point number and outputs a corresponding third floating-point number, wherein: the first floating-point number and the second floating-point number have a first format, and the third floating-point number has a second format that is different than the first format; the first floating-point number and the second floating-point number have a first dynamic range, and the third floating-point number has a second dynamic range that is less than the first dynamic range; and the floating-point adder circuit includes a first shifter for denormalizing the first floating-point number and a second shifter for denormalizing the second floating-point number such that a normal-range result of first floating-point number and the second floating-point number is converted to a subnormal range of the third floating-point number.

Example 2 is the integrated circuit of example 1, further comprising: a first floating-point multiplier that receives a first set of floating-point numbers and that outputs the first floating-point number; and a second floating-point multiplier that receives a second set of floating-point number and that outputs the second floating-point number.

Example 3 is the integrated circuit of example 2, wherein the first and second sets of floating-point numbers have a third format that is different than the first format.

Example 4 is the integrated circuit of example 3, wherein the third format is the same as the second format.

Example 5 is the integrated circuit of example 3, wherein a subnormal-range result of the first set of floating-point numbers is converted to a normal range of the first floating-point number, and wherein a subnormal-range result of the second set of floating-point numbers is converted to a normal range of the second floating-point number.

Example 6 is the integrated circuit of example 5, wherein a normal-range result of the first and second floating-point numbers is converted to an exception-condition range of the third-point floating-point number.

Example 7 is the integrated circuit of example 6, wherein an exception result of the first floating-point number and the second floating-point number is converted to a normal range of the third floating-point number.

Example 8 is the integrated circuit of example 7, wherein an out-of-range result of the first floating-point number and the second floating-point number is converted to the normal range of the third floating-point number without losing information contained in the first and second floating-point numbers.

Example 9 is the integrated circuit of any one of examples 1-8, wherein the floating-point adder circuit comprises: near-path circuitry that operates on the first and second floating-point numbers having an exponent difference that is equal to zero or one; and far-path circuitry that operates on the first and second floating-point numbers having an exponent difference that is greater than one, wherein the far-path circuitry is further configured to operate on the first and second floating-point numbers having an exponent difference that is equal to zero or one while performing an addition operation, and wherein the first and second shifters are part of the far-path circuitry.

Example 10 is the integrated circuit of example 9, wherein the far-path circuitry comprises: a rounding circuit; and a selection circuit, wherein the far-path circuitry is further configured to operate on the first and second floating-point numbers having an exponent difference that is equal to zero or one while performing a subtraction operation and when the selection circuit determines that a left-shift normalization is not needed and a rounding operation is possible.

Example 11 is the integrated circuit of example 10, wherein a path in the floating-point adder circuit that is not used for processing a set of numbers is flushed to zero.

Example 12 is a method of operating an integrated circuit, the method comprising: with a floating-point adder on the integrated circuit, receiving a first floating-point number and a second floating-point number; with the floating-point adder, outputting a corresponding third floating-point number, wherein the first and second floating-point numbers have a first format having a first dynamic range, and wherein the third floating-point number has a second format having a second dynamic range that is less than the first dynamic range.

Example 13 is the method of example 12, further comprising: converting a normal-range result of the first and second floating-point numbers to a subnormal range of the third floating-point number.

Example 14 is the method of example 12, further comprising: with a first multiplier on the integrated circuit, receiving a first set of floating-point numbers and outputting the first floating-point number; with a second multiplier on the integrated circuit, receiving a second set of floating-point numbers and outputting the second floating-point number, wherein the first and second sets of floating-point numbers have the first format; converting a subnormal-range result of the first set of floating-point numbers to a normal range of the first floating-point number; and converting a subnormal-range result of the second set of floating-point numbers to a normal range of the second floating-point number.

Example 15 is the method of any one of examples 12-14, further comprising: converting a normal-range result of the first and second floating-point numbers to an exception-condition range of the third-point floating-point number; converting an exception result of the first and second floating-point numbers to a normal range of the third floating-point number; and converting an out-of-range result of the first and second floating-point numbers to the normal range of the third floating-point number without losing information contained in the first and second floating-point numbers.

Example 16 is an integrated circuit, comprising: a specialized processing block that comprises: a first multiplier configured to generate a first product; a second multiplier configured to generate a second product; and a floating-point adder circuit that receives the first and second products and that generates a corresponding output, wherein the floating-point adder circuit is operable in a plurality of modes to support subnormal numbers.

Example 17 is the integrated circuit of example 16, wherein the floating-point adder is configured to receive the first and second products in a half precision format that uses a 5-bit exponent field when the floating-point adder is placed in a first of the plurality of modes.

Example 18 is the integrated circuit of example 17, wherein the floating-point adder is configured to receive the first and second products in a modified half precision format that uses an 8-bit exponent field when the floating-point adder is placed in a second of the plurality of modes.

Example 19 is the integrated circuit of example 18, wherein the floating-point adder is configured to generate the output in the half precision format when the floating-point adder is placed in the second of the plurality of modes.

Example 20 is the integrated circuit of any one of examples 18-19, wherein the floating-point adder is configured to receive the first and second products in the modified half precision format and to generate the output also in the modified half precision format when the floating-point adder is placed in a third of the plurality of modes.

Example 21 is an integrated circuit, comprising: means for receiving a first floating-point number and a second floating-point number and outputting a corresponding third floating-point number, wherein the first and second floating-point numbers have a first format having a first dynamic range, and wherein the third floating-point number has a second format having a second dynamic range that is less than the first dynamic range.

Example 22 is the integrated circuit of example 21, further comprising: means for converting a normal-range result of the first and second floating-point numbers to a subnormal range of the third floating-point number.

Example 23 is the integrated circuit of example 21, further comprising: means for receiving a first set of floating-point numbers and outputting the first floating-point number; means for receiving a second set of floating-point numbers and outputting the second floating-point number, wherein the first and second sets of floating-point numbers have the first format; means for converting a subnormal-range result of the first set of floating-point numbers to a normal range of the first floating-point number; and means for converting a subnormal-range result of the second set of floating-point numbers to a normal range of the second floating-point number.

Example 24 is the integrated circuit of any one of examples 21-23, further comprising: means for converting a normal-range result of the first and second floating-point numbers to an exception-condition range of the third-point floating-point number; means for converting an exception result of the first and second floating-point numbers to a normal range of the third floating-point number.

Example 25 is the integrated circuit of any one of examples 21-23, further comprising: means for converting an out-of-range result of the first and second floating-point numbers to the normal range of the third floating-point number without losing information contained in the first and second floating-point numbers.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit, comprising:
   a floating-point adder circuit that receives a first floating-point number and a second floating-point number and outputs a corresponding third floating-point number, wherein:
   the first floating-point number and the second floating-point number have a first format, and the third floating-point number has a second format that is different than the first format;
   the first floating-point number and the second floating-point number have a first dynamic range, and the third floating-point number has a second dynamic range that is less than the first dynamic range; and
   the floating-point adder circuit includes a first shifter for denormalizing the first floating-point number and a second shifter for denormalizing the second floating-point number such that a normal-range result of the first floating-point number and the second floating-point number is converted to a subnormal range of the third floating-point number.

2. The integrated circuit of claim 1, further comprising:
a first floating-point multiplier that receives a first set of floating-point numbers and that outputs the first floating-point number; and
a second floating-point multiplier that receives a second set of floating-point number and that outputs the second floating-point number.

3. The integrated circuit of claim 2, wherein the first and second sets of floating-point numbers have a third format that is different than the first format.

4. The integrated circuit of claim 3, wherein the third format is the same as the second format.

5. The integrated circuit of claim 3, wherein a subnormal-range result of multiplication of the first set of floating-point numbers is converted to a normal range of the first floating-point number, and wherein a subnormal-range result of multiplication of the second set of floating-point numbers is converted to a normal range of the second floating-point number.

6. The integrated circuit of claim 5, wherein a normal-range result of addition of the first and second floating-point numbers is converted to an exception-condition range of the third floating-point number.

7. The integrated circuit of claim 6, wherein an exception result of addition of the first floating-point number and the second floating-point number is converted to a normal range of the third floating-point number.

8. The integrated circuit of claim 7, wherein an out-of-range result of addition of the first floating-point number and the second floating-point number is converted to the normal range of the third floating-point number without losing information contained in the first and second floating-point numbers.

9. The integrated circuit of claim 1, wherein the floating-point adder circuit comprises:
near-path circuitry that operates on the first and second floating-point numbers having an exponent difference that is equal to zero or one; and
far-path circuitry that operates on the first and second floating-point numbers having an exponent difference that is greater than one, wherein the first and second shifters are part of the far-path circuitry.

10. The integrated circuit of claim 9, wherein the far-path circuitry comprises:
a rounding circuit; and
a selection circuit, wherein the far-path circuitry is further configured to operate on the first and second floating-point numbers having an exponent difference that is equal to zero or one while performing a subtraction operation and when the selection circuit determines that a left-shift normalization is not needed.

11. The integrated circuit of claim 10, wherein a path in the floating-point adder circuit that is not used for processing a set of numbers is flushed to zero.

12. A method of operating an integrated circuit, the method comprising:
with a floating-point adder on the integrated circuit, receiving a first floating-point number and a second floating-point number;
with the floating-point adder, outputting a corresponding third floating-point number, wherein the first and second floating-point numbers have a first format having a first dynamic range, and wherein the third floating-point number has a second format having a second dynamic range that is less than the first dynamic range.

13. The method of claim 12, further comprising:
converting a normal-range result of addition of the first and second floating-point numbers to a subnormal range of the third floating-point number.

14. The method of claim 12, further comprising:
with a first multiplier on the integrated circuit, receiving a first set of floating-point numbers and outputting the first floating-point number;
with a second multiplier on the integrated circuit, receiving a second set of floating-point numbers and outputting the second floating-point number, wherein the first and second sets of floating-point numbers have the first format;
converting a subnormal-range result of multiplication of the first set of floating-point numbers to a normal range of the first floating-point number; and
converting a subnormal-range result of multiplication of the second set of floating-point numbers to a normal range of the second floating-point number.

15. The method of claim 12, further comprising:
converting a normal-range result of addition of the first and second floating-point numbers to an exception-condition range of the third-point floating-point number;
converting an exception result of addition of the first and second floating-point numbers to a normal range of the third floating-point number; and
converting an out-of-range result of addition of the first and second floating-point numbers to the normal range of the third floating-point number without losing information contained in the first and second floating-point numbers.

16. An integrated circuit, comprising:
a specialized processing block that comprises:
a first multiplier configured to generate a first product;
a second multiplier configured to generate a second product; and
a floating-point adder circuit that receives the first and second products and that generates a corresponding output, wherein the floating-point adder circuit is operable in a plurality of modes to support subnormal numbers.

17. The integrated circuit of claim 16, wherein the floating-point adder is configured to receive the first and second products in a half precision format that uses a 5-bit exponent field when the floating-point adder is placed in a first of the plurality of modes.

18. The integrated circuit of claim 17, wherein the floating-point adder is configured to receive the first and second products in a modified half precision format that uses an 8-bit exponent field when the floating-point adder is placed in a second of the plurality of modes.

19. The integrated circuit of claim 18, wherein the floating-point adder is configured to generate the output in the half precision format when the floating-point adder is placed in the second of the plurality of modes.

20. The integrated circuit of claim 18, wherein the floating-point adder is configured to receive the first and second products in the modified half precision format and to generate the output also in the modified half precision format when the floating-point adder is placed in a third of the plurality of modes.

* * * * *